(12) United States Patent  
Jansen et al.

(10) Patent No.: US 11,467,504 B2  
(45) Date of Patent: Oct. 11, 2022

(54) PIEZOELECTRIC ACTUATOR, ACTUATOR SYSTEM, SUBSTRATE SUPPORT, AND LITHOGRAPHIC APPARATUS INCLUDING THE ACTUATOR

(71) Applicant: ASML Netherlands B.V., Veldhoven (NL)

(72) Inventors: Bas Jansen, Den Bosch (NL); Hans Butler, Best (NL); Alexander Pascal Dijkshoorn, Enschede (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/267,708

(22) PCT Filed: Jul. 15, 2019

(86) PCT No.: PCT/EP2019/068963  
§ 371 (c)(1),  
(2) Date: Feb. 10, 2021

(87) PCT Pub. No.: WO2020/035242  
PCT Pub. Date: Feb. 20, 2020

(65) Prior Publication Data  
US 2021/0318624 A1 Oct. 14, 2021

(30) Foreign Application Priority Data  
Aug. 16, 2018 (EP) .................................... 18189293

(51) Int. Cl.  
*G03F 7/20* (2006.01)  
*H01L 41/09* (2006.01)  
(Continued)

(52) U.S. Cl.  
CPC ...... *G03F 7/70758* (2013.01); *G03F 7/70783* (2013.01); *H01L 41/0993* (2013.01); *H02N 2/028* (2013.01); *H02N 2/062* (2013.01)

(58) Field of Classification Search  
CPC .......... G03F 7/70758; G03F 7/707083; H02N 2/028; H02N 2/062; H01L 41/0993  
See application file for complete search history.

(56) References Cited

U.S. PATENT DOCUMENTS

| 4,504,045 A | 3/1985 | Kenbo et al. |
| 6,020,964 A | 2/2000 | Loopstra et al. |

(Continued)

FOREIGN PATENT DOCUMENTS

| CN | 201188587 Y | 1/2009 |
| CN | 101895231 B | 11/2010 |

(Continued)

OTHER PUBLICATIONS

International Search Report and Written Opinion of the International Searching Authority directed to related International Patent Application No. PCT/EP2019/068963, dated Sep. 30, 2019; 11 pages.

(Continued)

*Primary Examiner* — Hung V Nguyen  
(74) *Attorney, Agent, or Firm* — Sterne, Kessler, Goldstein & Fox P.L.L.C.

(57) ABSTRACT

The invention provides a substrate support arranged to support a substrate, comprising piezo a actuator, further comprising a first pair of electrodes, a second pair of electrodes and a piezo material having a first surface and a second surface. The first surface is arranged along a first direction and second direction. The first pair of electrodes comprises a first electrode arranged on the first surface and a second electrode arranged on the second surface. The (Continued)

second pair of electrodes is arranged to shear the piezo material. The first pair of electrodes is arranged to elongate the piezo material in a third direction perpendicular to the first direction and second direction. The first electrode is divided into at least two parts and is arranged to rotate the first surface and the second surface relatively to each other about the first direction wherein the piezo actuator is arranged to support the substrate.

19 Claims, 6 Drawing Sheets

(51) Int. Cl.
    *H02N 2/02*     (2006.01)
    *H02N 2/06*     (2006.01)

(56) References Cited

U.S. PATENT DOCUMENTS

| | | |
|---|---|---|
| 6,952,253 B2 | 10/2005 | Lof et al. |
| 8,299,682 B2* | 10/2012 | Takizawa ............. H02N 2/0045 310/333 |
| 10,491,140 B2* | 11/2019 | Zhang .................. H02N 2/0095 |
| 2007/0058173 A1 | 3/2007 | Holzapfel |
| 2009/0201477 A1 | 8/2009 | Butler |
| 2009/0225388 A1 | 9/2009 | Zaifrani et al. |
| 2011/0234049 A1 | 9/2011 | Takizawa |
| 2016/0211776 A1 | 7/2016 | Ting et al. |

FOREIGN PATENT DOCUMENTS

| | | |
|---|---|---|
| EP | 0 308 970 A2 | 3/1989 |
| JP | S59230472 A | 12/1984 |
| WO | WO 01/90820 A1 | 11/2001 |
| WO | WO 2013/160082 A1 | 10/2013 |

OTHER PUBLICATIONS

International Preliminary Report on Patentability directed to related International Patent Application No. PCT/EP2019/068963, dated Feb. 16, 2021; 7 pages.

Rausch et al., "Unimorph piezoelectric deformable mirrors for space telescopes," Proc. SPIE, vol. 9904, Space Telescopes and Instrumentation 2016: Optical, Infrared, and Millimeter Wave, Jul. 29, 2016; 12 pages.

\* cited by examiner

PIEZOELECTRIC ACTUATOR, ACTUATOR SYSTEM, SUBSTRATE SUPPORT, AND LITHOGRAPHIC APPARATUS INCLUDING THE ACTUATOR

CROSS-REFERENCE TO RELATED APPLICATION

This application claims priority of EP application 18189293.6 which was filed on Aug. 16, 2018 and which is incorporated herein in its entirety by reference.

FIELD

The present invention relates to a piezo actuator, a piezo actuator system comprising the piezo actuator, a substrate support comprising the piezo actuator and a lithographic apparatus comprising the piezo actuator.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Piezo actuators comprise piezo electric material that deforms when a voltage or an electrical charge is applied over the piezo electric material via electrodes. Depending on the shape of the piezo electric material and the location of the electrodes on the piezo electric material, the piezo electric material may expand, retract, shear etc. Piezo actuators may be used when rapid or high precision actuation is needed.

When an actuator is required that can actuate in multiple degrees of freedom, typically multiple piezo actuators are put together. For example, a shear piezo is connected to a translating piezo. The result is a large piezo actuator, which is undesired in situations where the available volume is restricted. Alternatively, such as described in CN 101895231A, published on Nov. 24, 2010, a piezo actuator can be formed by applying multiple electrodes on piezo electric material. The multiple electrodes are controlled such that the top surface of the piezo actuator can make a swivel movement in two degrees of freedom. Due to the Poisson ration of the piezo electric material, the accuracy with which the top surface can be moved is limited.

As described in U.S. Pat. No. 4,504,045, published on Mar. 12, 1985, piezo actuators can be arranged on a substrate support for holding the substrate. By controlling the length of the piezo actuators, the substrate can be brought in a desired flatness.

SUMMARY

It is an objective of the invention to provide a substrate support arranged to support a substrate comprising a piezo actuator to correct the shape of the substrate with improved accuracy. To accurately project patterns on multiple layers on the substrate, not only the flatness of the substrate needs to be controlled. Also in-plane deformation, i.e., deformations in the plane formed by the main surface (in the xy-plane) of the substrate needs to be controlled.

According to an embodiment of the invention, there is provided a substrate support arranged to support a substrate comprising a piezo actuator, further comprising a piezo material having a first surface and a second surface, wherein the first surface is arranged along a first direction and a second direction; a first pair of electrodes comprising a first electrode arranged on the first surface and a second electrode arranged on the second surface; a second pair of electrodes arranged to shear the piezo material, wherein the first pair of electrodes is arranged to elongate the piezo material in a third direction perpendicular to the first direction and second direction, characterized in that the first electrode is divided into at least two parts.

According to another embodiment of the invention, there is provided a substrate support system, comprising the substrate support, further comprising an amplifier, wherein the amplifier is arranged to provide one of the parts with a first voltage or charge and the other one of the parts with a second voltage or charge, wherein the first voltage or charge is different from the second voltage or charge.

According to a further embodiment of the invention, there is provided a lithographic apparatus, comprising a mask support arranged to support a patterning device having a pattern; a substrate support arranged to support a substrate; a projection system arranged to project the pattern on the substrate, and wherein the substrate support is provided with a plurality of piezo actuators, wherein the plurality of piezo actuators are arranged to support the substrate.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
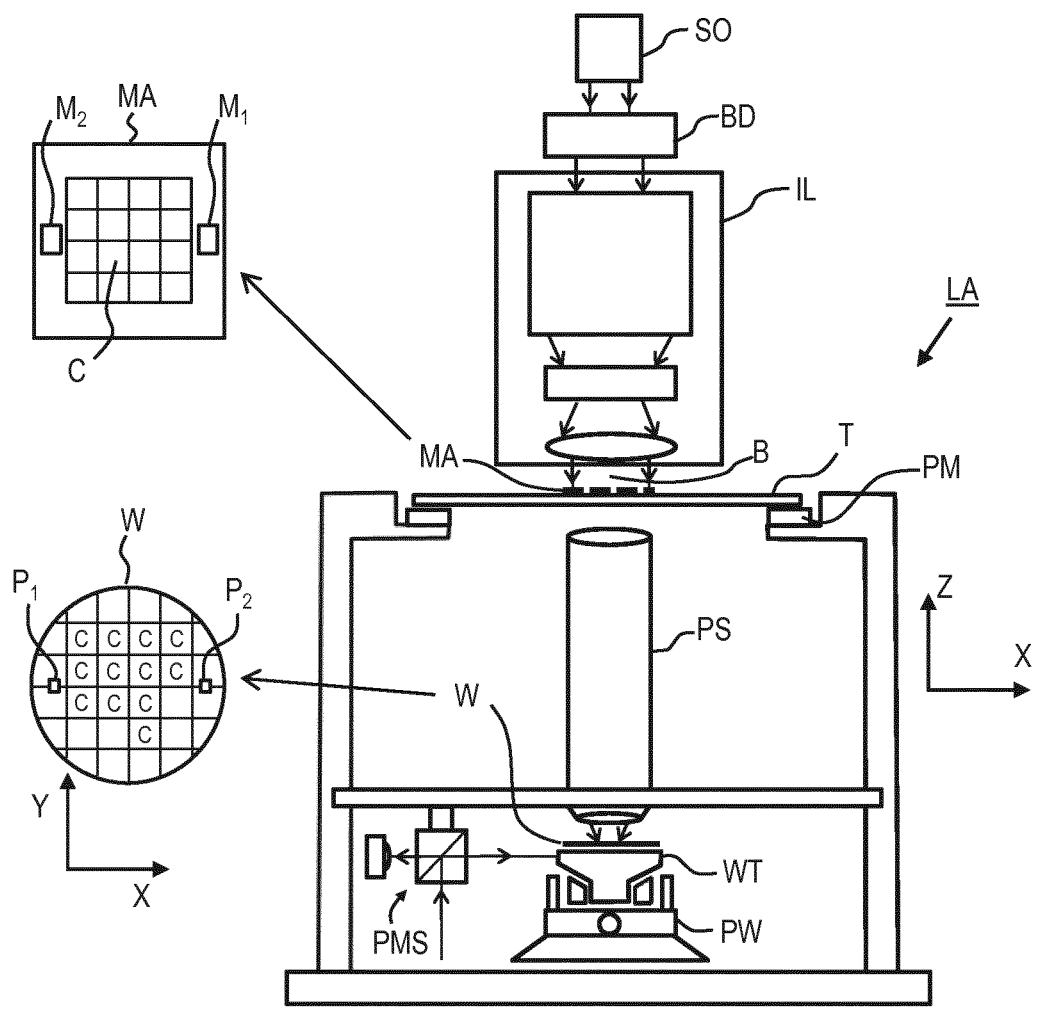
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
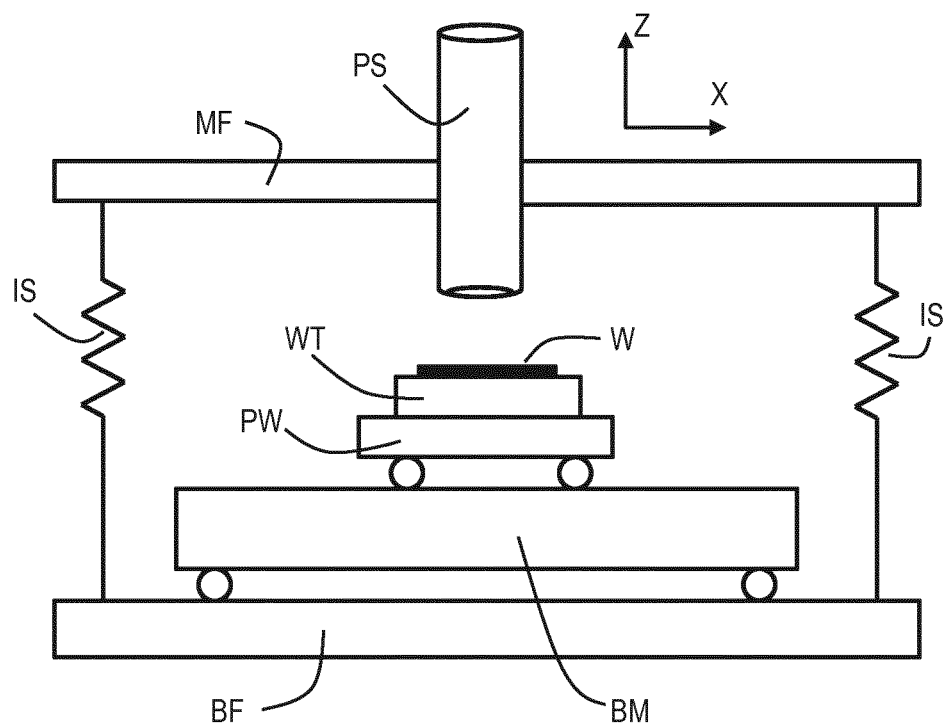
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, United States patent U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
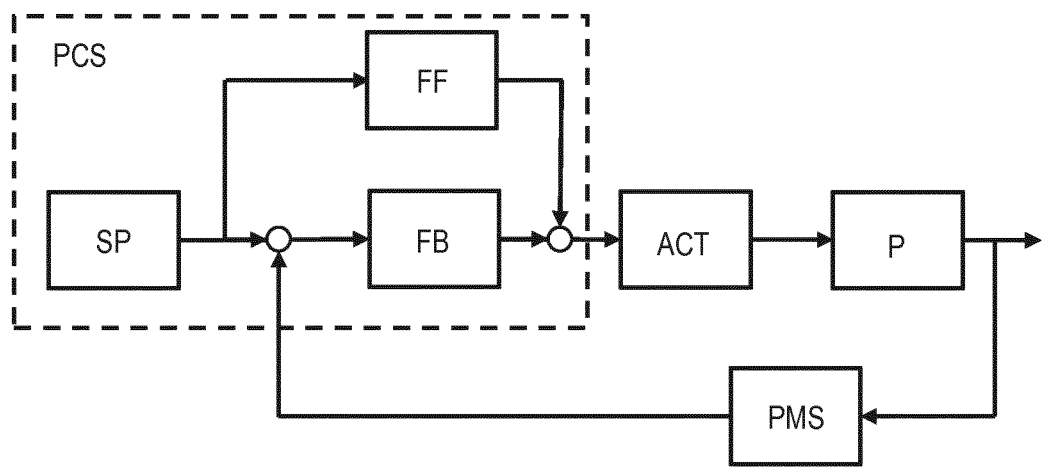
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
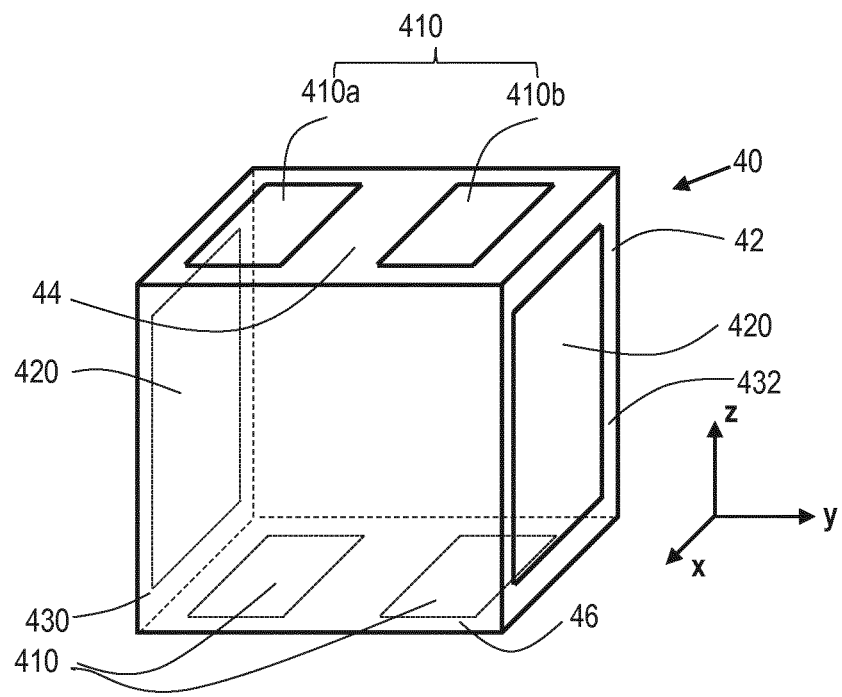
FIG. 4 schematically depicts a piezo actuator according to an embodiment of the invention.

FIG. 4 schematically depicts a piezo actuator 40 according to an embodiment of the invention. The isometric view of the piezo actuator 40 shows dashed lines to indicate features that would not be visible from this point of view. The piezo actuator 40 comprises a piezo material 42. The piezo material 42 has a first surface 44 and a second surface 46. The first surface 44 is arranged along a first direction (x) and a second direction (y). The first direction (x) and the second direction (y) may be perpendicular to each other. The piezo actuator 40 comprises a first pair of electrodes 410 comprising a first electrode and a second electrode. The first electrode is arranged on the first surface 44. The second electrode is arranged on the second surface 46. A second pair of electrodes 420 is arranged to shear the piezo material 42. The first pair of electrodes 410 is arranged to elongate the piezo material 42 in a third direction (z). The third direction (z) is perpendicular to the first direction (x) and the second direction (y). The first electrode is arranged to provide at least two different voltages to the first surface 44 simultaneously. The first electrode on the first surface 44 is divided into at least two parts 410a, 410b. Part 410a is arranged to provide a voltage or charge to the first surface 44 different than a voltage or charge provided by part 410b.

The piezo material 42 may comprise any suitable piezo electric material, such as lead zirconate titanate (PZT), lead magnesium niobate (PMN), barium titanate (BATiO$_3$), potassium niobite (KNbO$_3$), lithium niobite (LiNbO$_3$), and/or sodium bismuth titanate (NaBi(TiO$_3$)$_2$). In this embodiment, the piezo material 42 is cube-shaped. Alternatively, the piezo material 42 can be beam shaped, hexagonally shaped, circularly shaped and/or cylindrical shaped.

The piezo material 42 further comprises a third surface 430 and a fourth surface 432. The third surface 430 and the fourth surface 432 may be parallel to each other. The third surface 430 and the fourth surface 432 may be opposite to each other. The third surface 430 and the fourth surface 432 may be adjacent to the first surface 44. The third surface 430 and the fourth surface 432 may be adjacent to the second surface 46. The third surface 430 and the fourth surface 432 may be side surfaces of the piezo actuator 40. The second pair of electrodes 420 is arranged on the third surface 430 and on the fourth surface 432.

The first surface 44 and the second surface 46 may be parallel to each other. The first surface 44 and the second surface 46 may be opposite to each other. The second surface 44 may be arranged to mount the piezo actuator 40 to another component. The first surface 44 may be the top surface of the piezo actuator 40. The second surface 46 may be the bottom surface of the piezo actuator 40.

Figure 11:
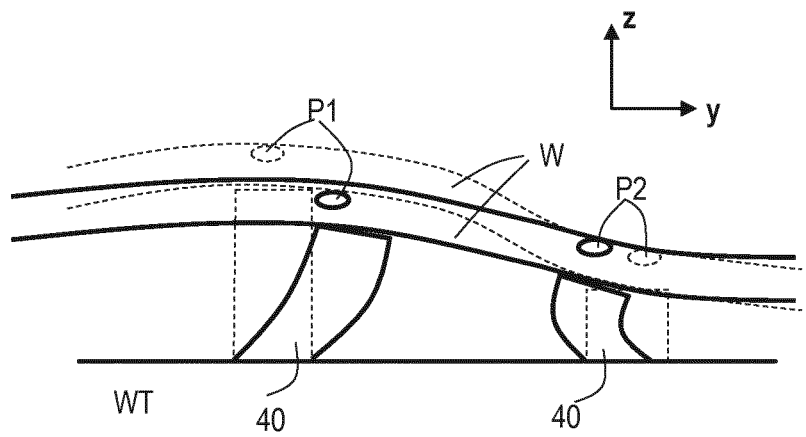
FIG. 11 schematically depicts a substrate support.

FIG. 11 schematically depicts a substrate support WT arranged to support the substrate W. In an initial state, which is indicated with dashed lines, the substrate W is loaded on the piezo actuators 40, while the piezo actuators 40 are not yet actuated. Due to the shape of the substrate W, the piezo actuator 40 on the right is compressed more than the piezo actuator 40 on the left. In a further state, which is indicated with the solid lines, the piezo actuators 40 are actuated to elongate and to shear. By the elongation, the substrate W is brought towards a desired flatness. By shearing, the substrate alignment marks P1, P2 are brought to their desired in-plane location. However, due to the limit stiffness of the piezo actuators 40 compared to in-plane stiffness of the substrate W, the piezo actuators 40 are bent. As a result, the desired flatness and in-plane locations of substrate alignment marks P1, P2 is not yet achieved.

Figure 5:
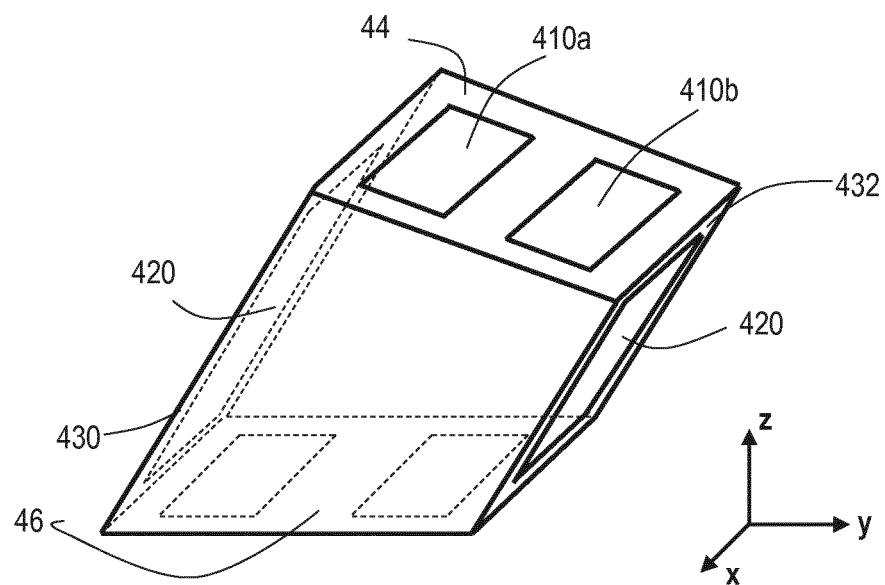
FIG. 5 schematically depicts the piezo actuator of FIG. 4 while shearing the piezo material.

FIG. 5 schematically depicts the piezo actuator 40 of FIG. 4 in the situation of FIG. 11. In FIG. 5, the first surface 44 is rotated, because of the shape of the substrate W, while shearing the piezo material 42. The second pair of electrodes 420 is arranged to move the first surface 44 and the second surface 46 relatively to each other in the second direction (y) when shearing the piezo material 42. The second pair of electrodes 420 comprises a third electrode and a fourth electrode. The third electrode is arranged on the third surface 430. The fourth electrode is arranged on the fourth surface 432. By applying a voltage, such a positive voltage, to the third electrode on the third surface 430, the third surface 430 may expand. By applying another voltage, such a negative voltage, to the fourth electrode on the fourth surface 432, the fourth surface 432 may contract. As a result, the piezo material 42 shears and the first surface 44 is moved along the second direction (y). What also is shown in FIG. 5, is that the first surface 44 is also rotated about the first direction (x) relative to the second surface 46. In an initial state, as shown in FIG. 4, the first surface 44 is parallel to the second surface 46. In a shear state, as shown in FIG. 5, the first surface 44 is not parallel to the second surface 46.

To restore the first surface 44 to the initial state, i.e., parallel to the second surface 46, the first electrode provides two different voltages to the first surface 44 simultaneously. A first voltage is provided to part 410a and a second voltage is provided to part 410b. As a result of the first voltage, a part of the piezo material 42 between part 410*a* and the second surface 46 may contract, whereas as a result of the second voltage, part of the piezo material 42 between part 410*b* and the second surface 46 may expand. Alternatively, as a result of the first voltage, part of the piezo material 42 between part 410*a* and the second surface 46 may expand a small amount, whereas as a result of the second voltage, part of the piezo material 42 between part 410*b* and the second surface 46 may expand a large amount. As another alternative, the first voltage is zero, and as a result of the second voltage, part of the piezo material 42 between part 410*b* and the second surface 46 may expand. As yet another alternative, the second voltage is zero and as a result of the first voltage, the part of the piezo material 42 between part 410*a* and the second surface 46 may contract.

Figure 6:
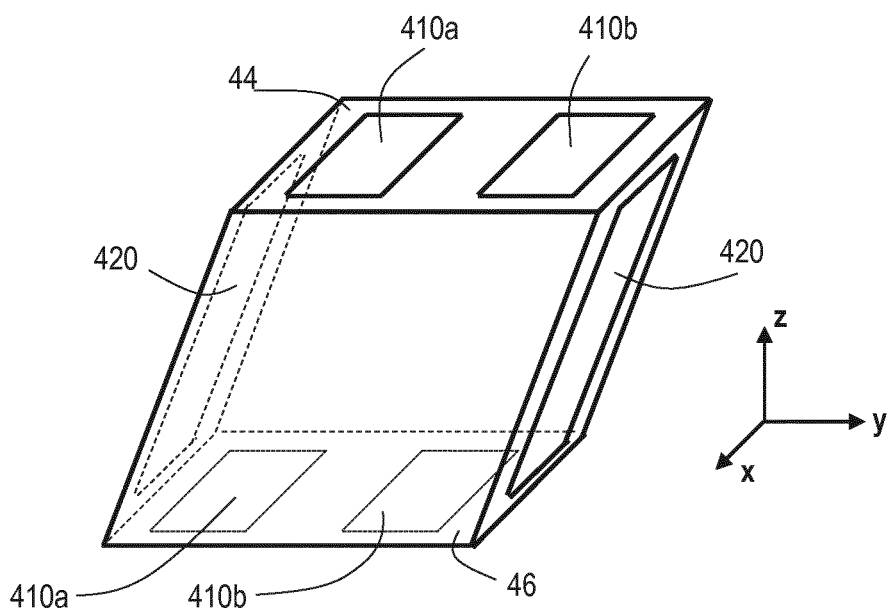
FIG. 6 schematically depicts the piezo actuator of FIG. 4 while shearing the piezo material.

As a result of applying the first voltage and the second voltage, the first pair of electrodes 410 is arranged to rotate the first surface 44 and the second surface 46 relatively to each other about the first direction (x). By rotating the first surface 44 and the second surface 46 relatively to each other about the first direction (x), the first surface 44 may be made parallel to the second surface 46, see FIG. 6. If a proper first voltage and a second voltage are applied, the rotation of the first surface 44 relatively to the second surface 46 can be set, independently of the amount of shear of the piezo material 42 by the second pair of electrodes 420.

The two parts 410*a*, 410*b* of the first pair of electrodes 410 may be electrically separated along the first direction (x). For example, two parts 410*a*, 410*b* are arranged on the first surface 44 with an offset relatively to each other along the second direction (y). The two parts 410*a*, 410*b* may be adjacent to each other if there is an electrical insulator in between the two parts 410*a*, 410*b*. The electrical insulator may extend along the first direction (x).

The two parts 410*a*, 410*b* may extend across the first surface 44 along the first direction (x). For example, each of the two parts 410*a*, 410*b* has one side adjacent to an edge of the first surface 44, and has an opposing side adjacent to another edge of the first surface 44.

Figure 7:
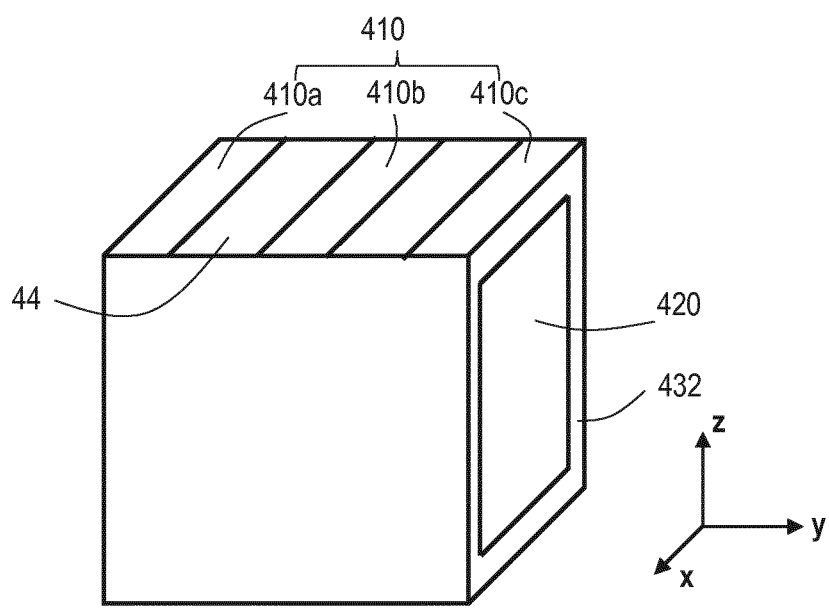
FIG. 7 schematically depicts another embodiment of the invention.

FIG. 7 schematically depicts another embodiment of the invention. In the embodiment of FIG. 7, the first electrode comprises three parts 410*a*, 410*b*, 410*c*. Part 410*b* is at the centre of the first surface 44. The part 410*a* is on the first surface 44 and on one side of the part 410*b* near an edge of the first surface 44. The part 410*c* is on the first surface 44 and on another side of the part 410*b* near an opposing edge of the first surface 44. The three parts 410*a*, 410*b*, 410*c* may extend across the first surface 44 along the first direction (x). The three parts 410*a*, 410*b*, 410*c* are electrically separated from each other along the first direction (x). Because the three parts 410*a*, 410*b*, 410*c* are electrically separated, each of the three parts 410*a*, 410*b*, 410*c* can be set at a different voltage. For example, the part 410*a* can be set at a negative voltage, the part 410*c* can be set at a positive voltage and the part 410*b* can be set at a voltage in between the negative voltage and the positive voltage.

Figure 8:
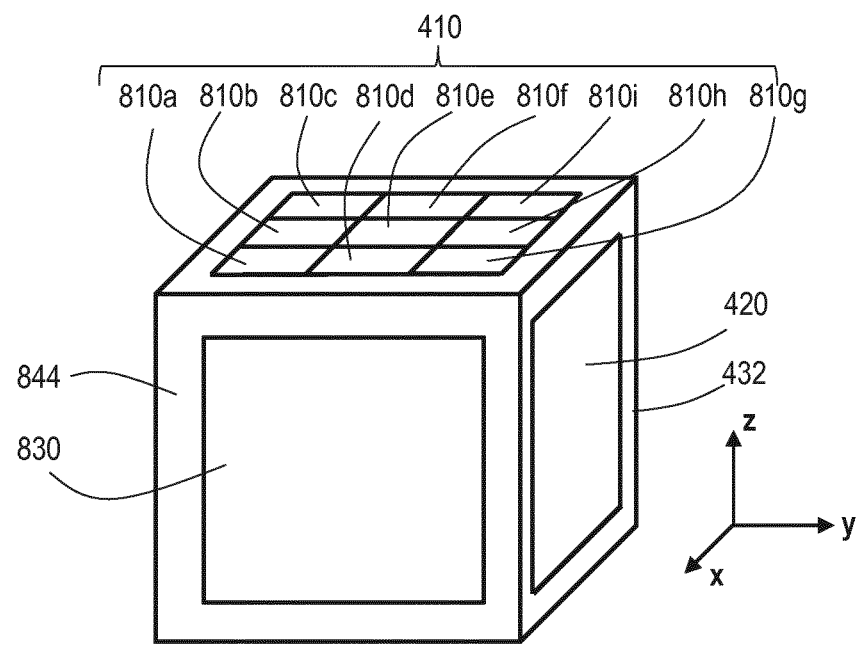
FIG. 8 schematically depicts a further embodiment of the invention.

FIG. 8 schematically depicts a further embodiment of the invention. In this embodiment, the piezo actuator 40 comprises a third pair of electrodes 830. The third pair of electrodes 830 comprises a fifth electrode and a sixth electrode. The fifth electrode is arranged on a fifth surface 844. The sixth electrode is applied to a sixth surface of the piezo material 42 opposite to the surface 844, not shown in FIG. 8. The third pair of electrodes 830 is arranged to shear the piezo material 42. The third pair of electrodes 830 is arranged to move the first surface 44 and the second surface 46 relatively to each other in the first direction (x) when shearing the piezo material 42.

By providing the piezo material 42 with the first pair of electrodes 410, the second pair of electrodes 420 and the third pair of electrodes 830, the piezo actuator 40 is able to move the first surface 44 in the x-direction, in the y-direction and in the z-direction. By providing the piezo material 42 with the first pair of electrodes 410, the second pair of electrodes 420 and the third pair of electrodes 830, the piezo actuator 40 is an actuator for movement in three degrees of freedom.

Note that instead of a voltage, an electrical charge may be applied to any one of the first pair of electrodes 410, the second pair of electrodes 420 and the third pair of electrodes 830. Instead of applying different voltages, different charges may be applied.

In the embodiment of FIG. 8, the first electrode is divided into nine parts, 810*a*-810*i*. Each of the nine parts 810*a*-810*i* may be provided with a different voltage. When the second pair of electrodes 420 shears the piezo material 42, the orientation of the first surface 44 can be corrected by applying different voltages to parts 810*a*, 810*b*, 810*c*, 810*g*, 810*h* and 810*i*. Parts 810*a*, 810*b*, 810*c* may work similarly as part 410*a* in FIG. 7. Parts 810*d*, 810*e* and 810*f* may work similarly as part 410*b* in FIG. 7. Parts 810*g*, 810*h* and 810*i* may work similarly as part 410*c* in FIG. 7. When there is only shear of the piezo material 42 by the second electrode 420, the nine parts 810*a*-810*i* may work in the same way as the embodiment of FIG. 7. However, when the third pair of electrodes 830 shears the piezo material 42, the first surface 44 is rotated relatively to the second surface 46 about the second direction (y). The rotation of the first surface 44 can be compensated by applying one voltage to the parts 810*c*, 810*f* and 810*i* and by applying a different voltage to the parts 810*a*, 810*d* and 810*g*.

When the piezo material 42 is sheared by both the second pair of electrodes 420 and the third pair of electrodes 830, the first surface 44 makes a combined rotation about the first direction (x) and the second direction (y). To compensate the combined rotation, each of the parts 810*a*-810*i* can be set at a different voltage. The parts 810*a*-810*i* are electrically isolated from each other. The parts 810*a*-810*i* may be adjacent to each other or may be at an offset to each other. In an embodiment, part 810*e* may be omitted. In that embodiment, the first electrode comprises eight parts on the first surface 44. In the embodiment of FIG. 8, the parts 810*a*-810*i* are arranged in three rows along the first direction (x) and in three columns along the second direction (y). By arranging the parts 810*a*-810*i* in this way, accurate movement of the first surface 44 during shearing by both the second electrode 420 and the third electrode 830 can be achieved.

The first electrode as applied to the first surface 44 is extensively described above. The second electrode as applied to the second surface 46 may have the same shape as the first electrode. Alternatively, the second electrode as applied to the second surface 46 has fewer parts than the first electrode. For example, the second electrode as applied to the second surface 46 has only a single part.

The piezo actuator 40 has been depicted with a single piece of piezo material 42. However, in an embodiment, the piezo actuator 40 comprises a stack of multiple pieces of piezo material 42. For example, multiple pieces of piezo material 42 are built on top of each other. In between the multiple pieces of piezo material 42, the first pair of electrodes 410 is applied. The first surface 44 of one piece of piezo material 42 is adjacent to the second surface 46 of another piece of piezo material 42 on top of the one piece of piezo material 42.

The different voltages that are to be applied to the first electrode can be provided by an amplifier. The amplifier is arranged to provide the first electrode with two different voltages simultaneously. In the embodiment of FIG. 7, the amplifier is arranged to provide three different voltages simultaneously. In the embodiment of FIG. 8, the amplifier is arranged to provide nine different voltages simultaneously. The amplifier may comprise a plurality of amplifiers. Each of the plurality of amplifiers is arranged to provide a different voltage. Each of the plurality of amplifiers may provide a voltage independently of the voltages provided by the other amplifiers. Instead of a plurality of amplifiers, a switchable amplifier may be used, i.e., a single amplifier that is arranged to provide different voltages to different electrodes sequentially.

The amplifier may be a voltage amplifier arranged to provide different voltages. The amplifier may be a charge amplifier arranged to provide different charges to the first electrode. A charge amplifier may provide control of the piezo actuator 40 with less hysteresis than a voltage amplifier. However, typically, because the charge amplifier uses reference capacitances, the charge amplifier is more complex. As a reference capacitance, a duplicate of the piezo material 42 may be used. The charge amplifier may be made switchable, i.e., a single amplifier that is arranged to provide different charges to different electrodes sequentially.

Figure 9:
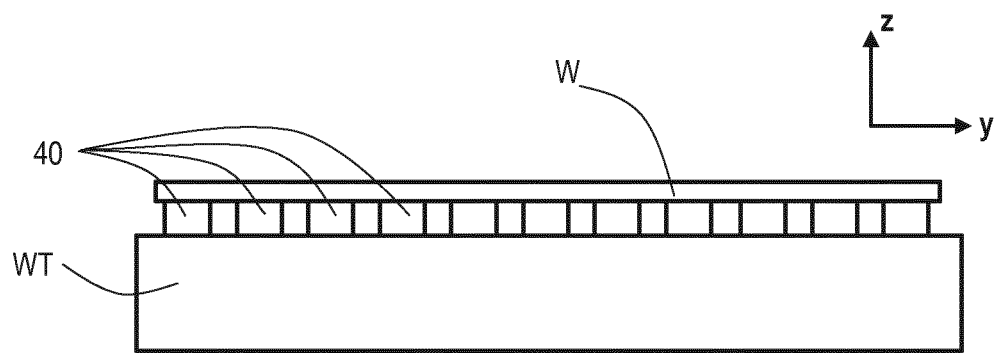
FIG. 9 schematically depicts a substrate support according to an embodiment of the invention.

FIG. 9 schematically depicts a substrate support WT according to an embodiment of the invention. In this embodiment, the substrate support WT is arranged to support a substrate W. The substrate support WT comprises a plurality of piezo actuators 40. The plurality of piezo actuators 40 are arranged to support the substrate W. Typically, the substrate support WT comprises a plurality of protrusions that form a support surface to support the substrate W. In this embodiment, some or all of the protrusions are replaced with the piezo actuators 40. By actuating the plurality of piezo actuators 40, the shape of the support surface can be changed. By changing the shape of the support surface, deformations of the substrate W can be corrected. For example, the substrate W may be unflat or warped due to various processes, such as etching and coating. The substrate W may become unflat or warped during exposure due to the radiation impinging on the substrate W. These processes may also cause in-plane deformation of the substrate W. In-plane deformation is deformation within the main surface of the substrate W, i.e., in the xy-plane.

Figure 10:
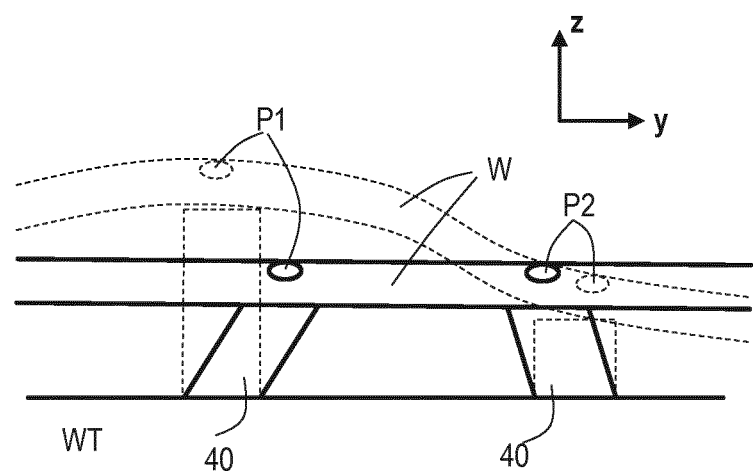
FIG. 10 schematically depicts a detail of the substrate support of FIG. 9.

FIG. 10 shows a detailed view how the piezo actuators 40 can adjust deformation of the substrate W. FIG. 10 shows the substrate W having two substrate alignment marks P1, P2. An initial situation is shown with dashed lines. In the initial situation the substrate W is unflat, i.e. deformed in the third direction (z). The substrate W is clamped onto the substrate support WT. Due to the unflatness of the substrate W, the piezo actuator 40 near substrate alignment mark P2 is compressed more than the piezo actuator 40 near substrate alignment mark P1. Further, due to the unflatness of the substrate W, substrate alignment mark P1 is too far to the left and substrate alignment mark P2 is too far to the right.

Now, the piezo actuator 40 near substrate alignment mark P1 is sheared by applying a voltage to the second pair of electrodes 420. Also, at least two different voltages are applied simultaneously to the first pair of electrodes 410 to compress the piezo actuator 40 and keep the first surface 44 properly into contact with the substrate W. By actuating the piezo actuator 40 near substrate alignment mark P1, the substrate W is made flat and substrate alignment mark P1 is placed onto its proper position, see the solid lines.

Also, the piezo actuator 40 near substrate alignment mark P2 is sheared by applying a voltage to second electrode 420. Also, at least two different voltages are applied simultaneously to the first pair of electrodes 410 to expand the piezo actuator 40 and keep the first surface 44 properly into contact with the substrate W. By actuating the piezo actuator 40 near substrate alignment mark P2, the substrate W is made flat and substrate alignment mark P2 is placed onto its proper position.

The result of actuating the two piezo actuators 40 is that the substrate W now has a sufficient flatness and that in-plane deformation is reduced by setting the substrate alignment marks P1, P2.

The piezo actuators 40 may be used to reduce static deformation of the substrate W. For example, wear of some of the protrusions that form the support surface may cause unflatness of the substrate W supported by the support surface. In another example, contamination on a protrusion may cause unflatness of the substrate W. After determining the amount of deformation of the substrate W, the piezo actuators 40 may be set to a certain setting and remain in this setting during exposure of the substrate W. A certain setting includes voltages on the first pair of electrodes 410 and the second pair of electrodes 420.

The piezo actuators 40 may be used to reduce dynamic deformation of the substrate W. For example, during exposure of the substrate W, the substrate W may heat up. Based on a thermal model or a measurement, such as a temperature measurement or an infrared measurement, the piezo actuators 40 may be set to a certain setting and may change this setting during exposure. Due to the substrate support WT moving back and forth during exposure, the substrate support WT and the substrate W may slip at least partly relatively to each other. Based on a model and/or a measurement, such as a position measurement between the substrate W and the substrate support WT, the piezo actuators 40 may be set to a certain setting and may change this setting during exposure.

In an embodiment, the first surface 44 is not directly in contact with the substrate W. For example, a coating is provided on the first surface 44, wherein the coating is in contact with the substrate W. The coating may be wear resistant to allow many loads and unloads or the substrate W onto and from the substrate support WT. The coating may be electrically isolating. Any other of suitable intermediate body may be provided on the first surface 44, wherein the intermediate body is in contact with the substrate W. The intermediate body may be another actuator, such as another piezo actuator. In an embodiment, the protrusions are supported by a first part of the substrate support WT. The first part of the substrate support WT is supported by the piezo actuators 40. The piezo actuators 40 are supported by a second part of the substrate support WT. By actuating the piezo actuators 40, the first part of the substrate support WT is deformed. By deforming the first part of the substrate support WT, the substrate W is deformed via the protrusions.

Similar to the embodiment of FIG. 9 and FIG. 10, a plurality of piezo actuators 40 may be applied to the mask support MT. The piezo actuators 40 may adjust deformation of the patterning device MA.

The amplifier may be arranged to provide the at least two different voltages or two different charges to each of the plurality of piezo actuators 40 based on shape information about the substrate W and/or the patterning device MA. The shape information can be provided by a measurement device outside the lithographic apparatus. The shape information can be provided by a measurement device inside the lithographic apparatus. The measurement device can measure the shape of the substrate W and/or the patterning device MA. The measurement device may comprise piezo elements, for example piezo elements arranged on the substrate support WT between the piezo actuators 40. The measurement device may be a level-sensor arranged to provided height information about the substrate W. The measurement device may be an alignment-sensor arranged to determine a position of the substrate alignment marks P1, P2. The piezo actuators 40 may apply self-sensing as a measurement device. For example, one piezo actuator 40 may be actuated and surrounding piezo actuators 40 may act as sensors.

The lithographic apparatus may comprise a loading mechanism arranged to load the substrate W onto the substrate support WT. The substrate support WT is provided with a plurality of piezo actuators 40. The amplifier is arranged to provide the at least two different voltages when the substrate W is at least partly supported by the loading mechanism.

The loading mechanism may be a loading pin that holds the substrate W at a bottom surface of the substrate W. The loading pin may be lowered into the substrate support WT until the substrate W makes contact with the support surface. There may be one loading pin or multiple loading pins, for example three loading pins. The amplifier may provide the at least two voltages when the substrate is supported by both the loading pin and at least some of the piezo actuators 40.

The loading mechanism may be a robot arm that holds the substrate W. The robot arm may lower the substrate support WT until the substrate W makes contact with the support surface. The robot arm may hold the substrate W at a bottom surface or at a top surface of the substrate W. The amplifier may provide the at least two voltages when the substrate is supported by both the robot arm and at least some of the piezo actuators 40.

The piezo actuators 40 described above may additionally or alternatively be used in different parts of the lithographic apparatus. For example, a piezo actuator 40 may be used in the projection system PS, for example, to move an optical element such as a mirror or lens. In another example, a piezo actuator 40 may be used in the illuminator, for example, to move an optical element such as a mirror or lens. The piezo actuator 40 may form part of the first positioner PM and/or part of second positioner PW.

Figure 12:
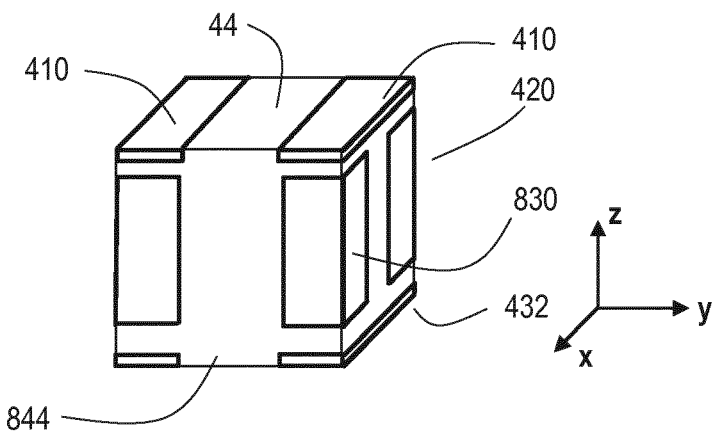
FIG. 12 schematically depicts yet another embodiment of the invention.

In an embodiment as shown in FIG. 12, the first electrode on the first surface 44 may extend beyond the first surface 44. In FIG. 12, the first electrode extends beyond an edge of the first surface 44 onto a fifth surface 844. In addition or alternatively, the first electrode may extend onto the third surface 430 and/or the fourth surface 432 and or the sixth surface. The first electrode on the first surface 44 may be only half on the first surface 44, whereas the other half is on another surface. The second electrode may extend beyond the second surface 46 onto the third surface 430, the fourth surface 432, the fifth surface 844 or the sixth surface. The second electrode on the second surface 46 may be only half on the second surface 46, whereas the other half is on another surface. The fourth electrode may extend beyond the fourth surface 432 onto the first surface 44, the second surface 46, the fifth surface 844 or the sixth surface. The fourth electrode on the fourth surface 432 may be only half on the fourth surface 432, whereas the other half is on another surface. As shown in FIG. 12, the fifth electrode on the fifth surface 844 may extend onto the third surface 430 and/or on the fourth surface 432. In addition or alternatively, the fifth electrode may extend onto the first surface 44 and/or the second surface 46. The fifth electrode on the fifth surface 844 may be only half on the fifth surface 844, whereas the other half is on another surface.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A substrate support arranged to support a substrate in a lithography system, comprising:
    a piezo actuator comprising:
        a piezo material having a first surface and a second surface, wherein the first surface is arranged along a first direction and a second direction;
        a first pair of electrodes comprising a first electrode arranged on the first surface and a second electrode arranged on the second surface; and
        a second pair of electrodes arranged to shear the piezo material,
    wherein the first pair of electrodes is arranged to elongate the piezo material in a third direction perpendicular to the first direction and second direction,
    wherein the first electrode is divided into at least two parts,
    wherein the piezo actuator is arranged to support the substrate, and
    wherein the substrate comprises a mask on a reticle stage, the reticle stage being the substrate support in the lithography system, or a wafer on a wafer table, the wafer table being the substrate support in the lithography system.

2. The substrate support of claim 1, wherein the first electrode is configured to rotate the first surface and the second surface relatively to each other about the first direction.

3. The substrate support of claim 1, wherein the second pair of electrodes is configured to move the first surface and the second surface relatively to each other in the second direction when shearing the piezo material.

4. The substrate support of claim 1, wherein the at least two parts extend across the first surface along the first direction.

5. The substrate support of claim 1, wherein the at least two parts comprise nine parts, wherein the nine parts are arranged in three rows along the first direction and in three columns along the second direction.

6. The substrate support of claim 1, wherein the first electrode extends beyond the first surface.

7. The substrate support of claim 6, wherein the second pair of electrodes comprises a third electrode arranged on a third surface and a fourth electrode arranged on a fourth surface, wherein the first electrode extends onto at least one of the third surface and second surface.

8. The substrate support of claim 1, comprising a third pair of electrodes, wherein the third pair of electrodes is configured to shear the piezo material, wherein the third pair of electrodes is configured to move the first surface and the second surface relatively to each other in the first direction when shearing the piezo material.

9. The substrate support of claim 8, wherein the third pair of electrodes comprises a fifth electrode arranged on a fifth surface and a sixth electrode arranged on a sixth surface, wherein the first electrode extends onto at least one of the fifth surface and the sixth surface.

10. The substrate support of claim 1, further comprising an amplifier, wherein the amplifier is configured to provide one of the parts with a first voltage or charge and the other one of the parts with a second voltage or charge, wherein the first voltage or charge is different from the second voltage or charge.

11. The substrate support system of claim 10, wherein the amplifier comprises a plurality of amplifiers, wherein one of the plurality of amplifiers is configured to provide the first voltage or charge and wherein another of the plurality of amplifiers is configured to provide the second voltage or charge.

12. The substrate support of claim 1 further comprising:
an amplifier configured to provide one of the parts with a first voltage or charge and the other one of the parts with a second voltage or charge,
wherein the first voltage or charge is different from the second voltage or charge, and
wherein the lithographic system is configured to base the first voltage or charge and the second voltage or charge on shape information about the substrate and/or about the patterning device.

13. The substrate support lithographic apparatus of claim 12, wherein the lithographic system further comprises:
a loading mechanism configured to load the substrate onto the substrate support,
wherein the amplifier is configured to provide the first voltage or charge and the second voltage or charge when the substrate is at least partly supported by the loading mechanism.

14. A substrate support arranged to support a substrate, comprising:
a piezo actuator comprising:
a piezo material having a first surface and a second surface, wherein the first surface is arranged along a first direction and a second direction;
a first pair of electrodes comprising a first electrode arranged on the first surface and a second electrode arranged on the second surface; and
a second pair of electrodes arranged to shear the piezo material,
wherein the first pair of electrodes is arranged to elongate the piezo material in a third direction perpendicular to the first direction and second direction,
wherein the first electrode is divided into at least two parts,
wherein the piezo actuator is arranged to support the substrate, and
wherein the first electrode is configured to rotate the first surface and the second surface relatively to each other about the first direction, or the second pair of electrodes is configured to move the first surface and the second surface relatively to each other in the second direction when shearing the piezo material.

15. The substrate support of claim 14, wherein the first electrode extends beyond the first surface.

16. The substrate support of claim 15, wherein the second pair of electrodes comprises a third electrode arranged on a third surface and a fourth electrode arranged on a fourth surface, wherein the first electrode extends onto at least one of the third surface and second surface.

17. The substrate support system 30, further comprising:
an amplifier,
wherein the amplifier is configured to provide one of the parts with a first voltage or charge and the other one of the parts with a second voltage or charge, and
wherein the first voltage or charge is different from the second voltage or charge.

18. A substrate support arranged to support a substrate, comprising:
a piezo actuator comprising:
a piezo material having a first surface and a second surface, wherein the first surface is arranged along a first direction and a second direction;
a first pair of electrodes comprising a first electrode arranged on the first surface and a second electrode arranged on the second surface;
a second pair of electrodes arranged to shear the piezo material,
wherein the first pair of electrodes is arranged to elongate the piezo material in a third direction perpendicular to the first direction and second direction,
wherein the first electrode is divided into at least two parts,
wherein the piezo actuator is arranged to support the substrate; and
a third pair of electrodes, wherein the third pair of electrodes is configured to shear the piezo material, wherein the third pair of electrodes is configured to move the first surface and the second surface relatively to each other in the first direction when shearing the piezo material.

19. The substrate support of claim 17, wherein:
the third pair of electrodes comprises a fifth electrode arranged on a fifth surface and a sixth electrode arranged on a sixth surface, and
the first electrode extends onto at least one of the fifth surface and the sixth surface.

* * * * *